US012732203B2

(12) United States Patent
Zhang et al.

(10) Patent No.: US 12,732,203 B2
(45) Date of Patent: Sep. 8, 2026

(54) DATA-PATH ARCHITECTURE FOR ANALOG-TO-DIGITAL CONVERTERS

(71) Applicant: Avago Technologies International Sales Pte. Limited, Singapore (SG)

(72) Inventors: Heng Zhang, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 90 days.

(21) Appl. No.: 18/821,667

(22) Filed: Aug. 30, 2024

(65) Prior Publication Data

US 2026/0066916 A1 Mar. 5, 2026

(51) Int. Cl.

| | |
|---|---|
| ***H03M 1/12*** | (2006.01) |
| ***H03F 3/45*** | (2006.01) |
| ***H04L 25/03*** | (2006.01) |

(52) U.S. Cl.

CPC ........ *H03M 1/124* (2013.01); *H03F 3/45179* (2013.01); *H04L 25/03038* (2013.01)

(58) Field of Classification Search

CPC ................ H03M 1/124; H03F 3/45179; H04L 25/03038

See application file for complete search history.

(56) References Cited

U.S. PATENT DOCUMENTS

| | | | | |
|---|---|---|---|---|
| 7,075,471 | B1 | 7/2006 | Gupta | |
| 9,397,680 | B2 * | 7/2016 | Xu | H03M 1/1061 |
| 10,404,265 | B1 * | 9/2019 | Farley | H03M 1/802 |
| 10,951,318 | B2 * | 3/2021 | Gopalakrishnan | H03L 7/23 |
| 2008/0094269 | A1 | 4/2008 | Bult et al. | |
| 2016/0352372 | A1 * | 12/2016 | Gorecki | H03K 5/023 |
| 2020/0274545 | A1 | 8/2020 | Schifmann et al. | |
| 2024/0421807 | A1 * | 12/2024 | Ngo | H03K 19/0016 |

OTHER PUBLICATIONS

Machine translation of CN-111082805-B (Year: 2023).*
Extended European Search Report mailed Jan. 29, 2026 in European Patent Application No. 25198485.2, 13 pages.

* cited by examiner

*Primary Examiner* — Jean B Corrielus
(74) *Attorney, Agent, or Firm* — Kim & Stewart LLP

(57) ABSTRACT

An example data path to a receiver includes: an analog front-end circuit (AFE) configured to receive a first voltage supply; a first circuit coupled to an output of the AFE, the first circuit including: a first buffer having an input coupled to the output of the AFE; a second buffer; a first switch coupled between an output of the first buffer and an input of the second buffer; and a second switch coupled between an output of the second buffer and an input of an ADC of the receiver; wherein the first buffer is configured to receive the first voltage supply, the second buffer is configured to receive a second voltage supply, and the ADC is configured to receive a third voltage supply less than the first voltage supply.

20 Claims, 7 Drawing Sheets

DATA-PATH ARCHITECTURE FOR ANALOG-TO-DIGITAL CONVERTERS

BACKGROUND

An analog-to-digital converter (ADC) can be an electronic device that converts an analog signal to a digital signal. An analog signal may be a continuous signal that varies over time. A digital signal may be a discrete signal represented by samples where each sample is a number. ADCs can be used in receivers. A receiver may be a circuit that accepts and processes a signal from a transmission medium, such as a transmission line. A transmission line may be a structure designed to carry electromagnetic waves. The term applies when the structure is long enough that the wave nature of the transmission must be considered. An ADC can be used in a receiver to convert an analog signal received from the transmission medium into a digital signal for further processing.

As data rates increase, receivers integrated with high-speed, high-resolution ADCs can be used to realize sophisticated equalization schemes, compensate for non-idealities, and achieve higher signal-to-noise ratio (SNR) at the receiver output. A time-interleaved structure can be used for high-speed ADCs. A time-interleaved ADC can be an ADC that achieves higher sampling rates by interleaving multiple ADC channels. A sampling rate may be the number of samples per unit time taken from a signal. Each ADC channel can operate at a fraction of the overall sampling rate, but when combined, produce a digital signal with a higher effective sampling rate. Each ADC channel can include an ADC referred to as a "unit-ADC." For example, a time-interleaved ADC can include four ADC channels, that is, four unit-ADCs.

As ADC sampling rate increases, a time-interleaved ADC may become larger in terms of implementation area on an integrated circuit (IC). This can result in larger loading of an analog front-end (AFE) of the receiver. An AFE may be a circuit of the receiver that receives an analog signal from the transmission medium. The AFE can be coupled to the ADC through a track-and-hold amplifier (THA). A THA, also known as a sample-and-hold amplifier, may be a circuit that captures and stabilizes an analog signal at specific points in time. The AFE, THA, and ADC can be referred to as a data-path of the receiver. Along the data-path, the AFE can be subject to the highest analog performance requirements. The ADC in contrast can be subject to more relaxed performance requirements while a target for reduced power consumption.

SUMMARY

In an embodiment, a data path for a receiver is described. The data path includes an analog front-end (AFE) configured to receive a first voltage supply. The data path includes a first circuit coupled to an output of the AFE. The first circuit includes a first buffer having an input coupled to the output of the AFE, a second buffer, a first switch coupled between an output of the first buffer and an input of the second buffer, and a second switch coupled between an output of the second buffer and an input of an ADC of the receiver. The first buffer is configured to receive the first voltage supply, the second buffer is configured to receive a second voltage supply, and the ADC is configured to receive a third voltage supply less than the first voltage supply.

In an embodiment, a receiver is described. The receiver includes an analog-to-digital converter (ADC), an analog front-end (AFE) configured to receive a first voltage supply, and a first circuit coupled between an output of the AFE and an input of the ADC. The first circuit includes a first buffer having an input coupled to the output of the AFE, a second buffer, a first switch coupled between an output of the first buffer and an input of the second buffer; and a second switch coupled between an output of the second buffer and the input of the ADC. The first buffer is configured to receive the first voltage supply, the second buffer is configured to receive a second voltage supply, and the ADC is configured to receive a third voltage supply less than the first voltage supply.

In an embodiment, a method of providing an input of an analog-to-digital converter (ADC) is described. The method includes receiving, by an analog front-end (AFE), an analog signal, the AFE operating using a first voltage supply. The method includes sampling, by a first circuit, an output of the AFE to provide the input of the ADC. The method includes supplying the first voltage supply to a first buffer of the first circuit. The method includes supplying a second voltage supply that is less than the first voltage supply to a second buffer of the first circuit. The method includes supplying a third voltage supply that is less than the second voltage supply to the ADC.

DETAILED DESCRIPTION

Figure 1:
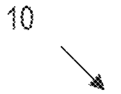
FIG. 1 is a block diagram depicting a communication circuit according to some embodiments.
Figure 1:
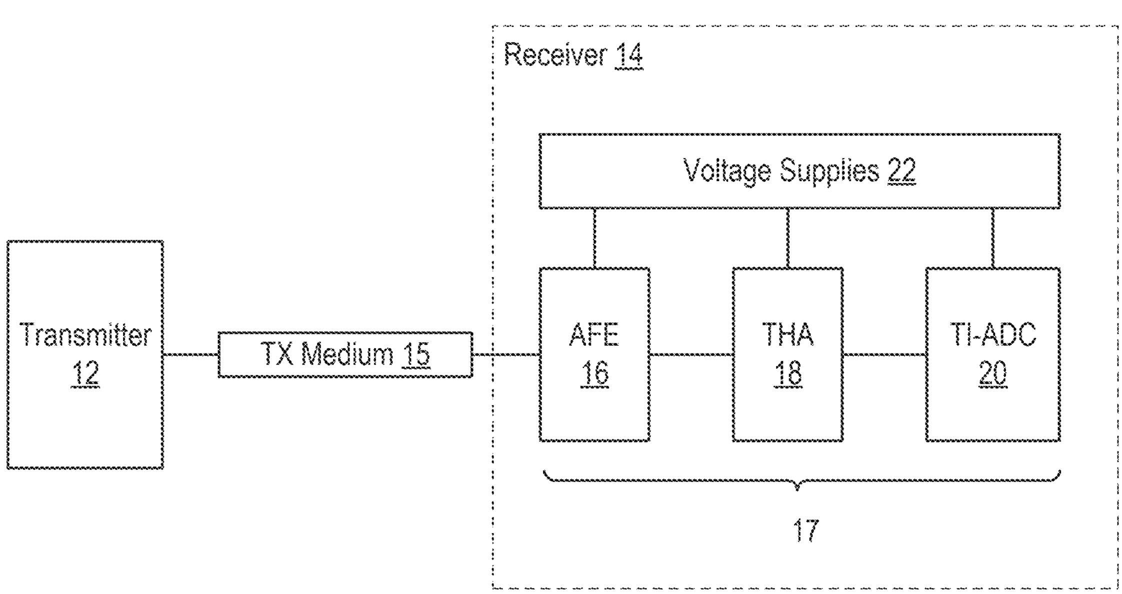

FIG. 1 is a block diagram depicting a communication circuit 10 according to some embodiments. Communication circuit 10 can include a transmitter 12 coupled to a receiver 14 by a transmission medium 15. A transmitter may be a circuit that transmits a signal through a transmission medium Transmitter 12 can transmit through transmission medium 15. A receiver may be a circuit that observes a signal propagating through a transmission medium. Receiver 14 can observe transmission medium 15. Transmission medium 15 may be a physical pathway for propagating a signal between transmitter 12 and receiver 14. In some examples, transmission medium 15 can be an electrical transmission line, such as conductors on a printed circuit board (PCB). However, embodiments described herein are not limited to an electrical transmission line between transmitter 12 and receiver 14. For example, transmission medium 15 can include an optical transmission line or a wireless transmission medium between transmitter 12 and receiver 14. In some embodiments, receiver 14 can be electrically coupled to transmission medium 15 directly, through an optical-to-electrical converter (not shown), or through an antenna (not shown), depending on the form of transmission medium 15. Each of receiver 14 and transmitter 12 can be used in various applications, such as stand-alone circuits or in transceivers for serializer/deserializers (SERDES), network devices, wireless devices, and the like.

Receiver 14 can include an AFE 16, a THA 18, a time-interleaved ADC (TI-ADC 20), and voltage supplies 22. AFE 16, THA 18, and TI-ADC 20 can be part of a data path 17 of receiver 14. Data path 17 may be circuits that process an input signal of receiver 14. Data path 17 can include intervening components (not shown). An input of AFE 16 can receive an electrical signal from transmission medium 15. An input of THA 18 can be coupled to an output of AFE 16. An input of TI-ADC 20 can be coupled to an output of THA 18. Voltage supplies 22 can be coupled to AFE 16, THA 18, and TI-ADC 20 to supply voltages thereto. A voltage supply may be a circuit that supplies a voltage to a load (e.g., AFE 16, THA 18, TI-ADC 20). While embodiments are described with respect to a TI-ADC, the THA described herein can be used with other types of ADCs, such as flash ADCs, successive approximation register (SAR) ADCs, sigma-delta ADCs, and the like. The unit-ADCs of TI-ADC 20 can be any of the aforementioned types of ADCs. Minimizing power consumption across different power domains while minimizing sampling switch variation can be challenging. The techniques described herein can provide an improved tolerance to process/voltage/temperature (PVT) variations while using multiple power domains to optimize power consumption.

To optimize power, TI-ADC 20 can operate using a low available supply voltage, referred to herein as VddL. To achieve high bandwidth, good linearity, and low noise, AFE 16 can operate using a high available supply voltage, referred to herein as VddH. Bandwidth may be a range of frequencies. Linearity in a circuit may be a proportional or near proportional relationship between quantities of interest (e.g., voltage and current). Noise in a circuit may be unwanted variations in a quantity (e.g., voltage, current, etc.). The voltage VddH may be a voltage higher than the voltage VddL. In embodiments, THA 18 can operate using a median supply voltage, referred to herein as VddM. The voltage VddM can be between the voltages VddH and VddL. Using the median supply voltage at THA 18 can provide a tradeoff between performance and power. Crossing different voltage domains from AFE 16 through THA 18 and to TI-ADC 20 can be a challenge in the data-path design. In other embodiments, VddM can be at or near either VddH or VddL.

Components along the data-path in receiver 14 can be sensitive to (PVT variations. For example, such components can include sampling switches in THA 18 and comparators in TI-ADC 20. A switch can be a component that can connect or disconnect a conducting path in a circuit. A sampling switch can be a switch of a circuit that samples a signal. The impact of PVT variations on the sampling switches is discussed further below. For each unit-ADC in TI-ADC 20, a comparator circuit (comparator) can be the component that limits the power, noise, and speed of TI-ADC 20. A comparator may be a circuit that compares signals. Comparator performance can be sensitive to PVT variations, as well as the input common-mode voltage. For example, a latch-based comparator may not have a well-controlled bias-current and the common-mode voltage can be dictated by the previous driving stage (e.g., THA 18). The variation in common-mode voltage at the unit-ADC can translate into large noise and speed variation, e.g., the SNR of the unit-ADC and conversion margin can vary over PVT. For example, to meet the timing specification for the slow process corner, a large clock switch can be required to provide a large bias current. However, the fast process corner can suffer from noise degradation due to excessive bias current generated by the large clock switch. Process corners in semiconductor manufacturing may refer to variations in the fabrication process that can lead to differences in performance (e.g., a slow process corner can have less performance than a fast process corner). On the other hand, for the fast process corner, smaller devices for a sampling switch can be used to reduce noise, but the slow process corner can suffer from speed degradation due to a small bias current. A bias current may be current used to set direct current (DC) operating conditions of a circuit. Thus, there can be a need for a data-path topology that achieves stable bandwidth, linearity, and speed under PVT variations.

Figure 2:
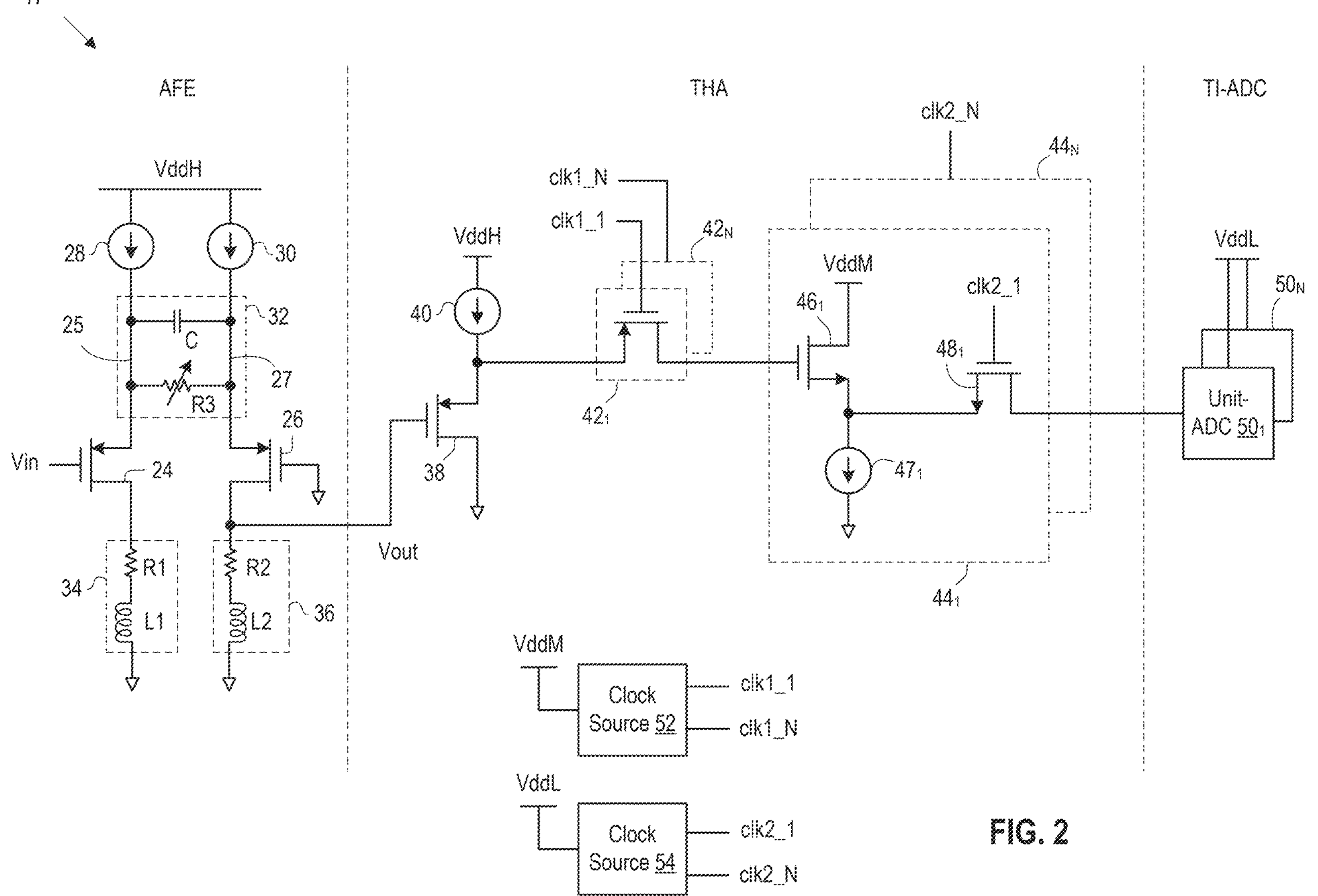
FIG. 2 is a schematic diagram depicting a data path of a receiver according to some embodiments.

FIG. 2 is a schematic diagram depicting data path 17 of receiver 14 according to some embodiments. AFE 16 can include transistor 24, transistor 26, current source 28, current source 30, impedance 32, impedance 34, and impedance 36. Transistors 24 and 26 can be P-type metal oxide semiconductor (PMOS) transistors. The source of transistor 24 can be coupled to a node 25. Current source 28 can be coupled between the voltage supply VddH and node 25. The source of transistor 26 can be coupled to a node 27. Current source 30 can be coupled between the voltage supply VddH and node 27. A current source may be a circuit that supplies or draws a current independent of voltage across the circuit less than a compliance voltage (e.g., the maximum voltage the current source can supply to a load beyond which the circuit stops being a current source). Impedance 32 can be coupled between nodes 25 and 27. In embodiments, impedance 32 can include a capacitor (C) in parallel with a resistor (R3).

Impedance 34 can be coupled between the drain of transistor 24 and electrical ground. Impedance 36 can be coupled between the drain of transistor 26 and electrical ground. In embodiments, impedance 34 can include a resistor (R1) in series with an inductor (L1), and impedance 36 can include a resistor (R2) in series with an inductor (L2). The gate of transistor 24 can recite a voltage signal Vin. A voltage signal may be an analog signal that varies in voltage. The voltage signal Vin can be received by receiver 14 (e.g., via a termination of transmission medium 15). The gate of transistor 26 can be coupled to electrical ground.

In operation, AFE 16 can function as a transconductance amplifier. A transconductance amplifier may generate a current that is a function of a voltage difference. The current generated in response to Vin can be turned into a voltage by impedance 36, which is referred to as voltage signal Vout.

In some embodiments, THA 18 can be a two-stage THA. The first stage of THA 18 can include a transistor 38, a current source 40, and transistors $\mathbf{42}_1$, $\mathbf{42}_2$, . . . , $\mathbf{42}_N$, where N is a positive integer. Transistor 38 can be a PMOS transistor. The gate of transistor 38 can be coupled to AFE 16 to receive the voltage signal Vout (e.g., coupled to the drain of transistor 26). Current source 40 can be coupled between the supply voltage VddH and the source of transistor 38. The drain of transistor 38 can be coupled to electrical ground. In operation, transistor 38 and current source 40 can function as a buffer amplifier (a "buffer"). A buffer may be a circuit having unity gain that isolates one circuit from another (e.g., buffering one circuit from being affected by currents in another circuit).

The second stage of THA 18 can include circuits $\mathbf{44}_1$ . . . $\mathbf{44}_N$. For purposes of clarity, FIG. 2 shows only the details of circuit $44_1$. Each of circuits $44_2$ . . . $44_N$ is identical to circuit $44_1$. Circuit $44_1$ includes a transistor $46_1$, a current source 471, and a transistor $48_1$. In general, circuit $44_k$ includes transistor $46_k$, current source $47_k$, and transistor $48_k$, where k=∈{1, 2, . . . , N}. Transistors $46_1$ . . . $46_N$ can each be an n-type metal oxide semiconductor (NMOS) transistor. The drain of each of transistors $46_1$ . . . $46_N$ can be coupled to the voltage supply VddM. Current source $47_k$ can be coupled between the source of transistor $46_k$ and electrical ground, where k∈{1, 2, . . . , N}. In operation, for each circuit $44_k$, transistor $46_k$ and current source $47_k$ can function as a buffer.

Transistors $42_1$ . . . $42_N$ can each be a PMOS transistor. The source of transistor $42_k$ can be coupled to the source of transistor 38, and the drain of transistor $42_k$ can be coupled to the gate of transistor $46_k$, where k∈{1, 2, . . . , N}. Data path 17 can include a clock source 52. A clock source can be a circuit configured to output clock signal(s). A clock signal can be a logic signal that oscillates between a first voltage and a second voltage higher than the first voltage. Clock source 52 can output clock signals clk1_1 through clk1_N (e.g., N clock signals). Each clock signal generated by clock source 52 can oscillate between the supply voltage VddM and electrical ground. The gate of transistor 42*k* can be coupled to receive the clock signal clk1_*k*, where k∈{1, 2, . . . , N}. For purposes of clarity, the connections between clock sources 52, 54 and the respective transistors $42_2$ . . . $42_N$ and transistors $46_2$ . . . $46_N$ are omitted from FIG. 2. In operation of some embodiments, each of transistors $42_1$ . . . 42 can function as a switch that is controlled by a respective clock signal.

Each of transistors $48_1$ . . . $48_N$ can be an NMOS transistor. The source of transistor $48_k$ can be coupled to the source of transistor $46_k$, the drain of transistor $48_k$ can be coupled to the input of a unit-ADC 50*k*, and the gate of transistor 48*k* can be coupled to receive a clock signal clk2_*k*, where k∈{1, 2, . . . , N}. Data path 17 can include a clock source 54. Clock source 54 can output clock signals clk2_1 through clk2_N (e.g., N clock signals). Each clock signal generated by clock source 54 can oscillate between the supply voltage VddL and electrical ground. In operation of some embodiments, each of transistors $48_1$ . . . $48_N$ can function as a switch that is controlled by a respective clock signal. TI-ADC 20 can include unit-ADCs $50_1$ . . . $50_N$. Each unit-ADC $50_1$ . . . $50_N$ can receive a supply voltage VddL.

In some embodiments, PMOS switches are used in the first stage of THA 18 (e.g., PMOS transistors 42). For a sampling switch, the path from source to drain can be represented by a linear resistor, Ron, as follows:

$$Ron = \frac{1}{\mu \ \mathrm{Cox} \ \frac{W}{L} \ Veffective}, \quad \text{Eq. 1}$$

where μ is the charge-carrier effective mobility, W is the gate width, L is the gate length, and Cox is the gate oxide capacitance per unit area. The voltage Veffective is Vgs−Vth, where Vgs is the gate-to-source voltage and Vth is the threshold voltage. A large Veffective variation can translate into a large Ron variation, which in turn can cause a large variation in bandwidth and linearity of TI-ADC 20 over PVT. A brute-force technique to reduce Ron variation can be to use a larger size sampling switch in the first stage of THA 18. A larger size sampling switch can include a larger size transistor in terms of implementation area. However, such a larger size sampling switch can increase the loading of clock source 52 and the path between clock source 52 and the gates of transistors $42_1$ . . . $42_N$.

For the second switches in THA 18 (e.g., transistors $48_1$ . . . $48_N$), large Vefffective variation can translate into hold phase leakage and degradation in ADC linearity. This can be worse for sampling switches in the second stage, since those switches can stay in hold mode for a longer period of time.

In some embodiments, THA 18 can include a two-stage THA 18 as shown and described above in FIG. 2. The two-stage THA includes a first stage, which can include a buffer and N sampling switches corresponding to N unit-ADCs of TI-ADC 20. The buffer of the first stage can be coupled to receive the voltage signal Vout from AFE 16. The second stage can include N buffers and N sampling switches. Each of the N sampling switches in the first stage can be coupled between the output of the buffer in the first stage and a respective one of the buffers in the second stage. Each of the sampling switches in the second stage can be coupled between a respective one of the buffers in the second stage and a respective one of the unit-ADCs 50. Data path 17 can use multiple voltage domains, e.g., VddH, VddM, and VddL. AFE 16 can use the higher voltage domain VddH due to more stringent bandwidth, noise, and linearity requirements. Unit-ADCs 50 can use the lower voltage domain VddL for conserving power. Likewise, the sampling switches in the second stage of THA 18 (e.g., transistors 48) can use the lower voltage domain VddL for conserving power. The sampling switches in the first stage of THA 18 (e.g., transistors 42) can use the median voltage domain VddM as a tradeoff between performance and power.

In some embodiments, the PMOS input AFE 16 can decouple the different voltage domains, eliminating the necessity of a level shifter and removing high voltage domain variations. A level shifter may be a circuit that shifts an input signal from one level to another level (e.g., one voltage to another voltage). The first stage of THA 18 can use a PMOS buffer at VddH to achieve good linearity. The second stage of THA 18 can use an NMOS buffer at VddM. This data path configuration can enable using VddM buffer to the second stage sampling switches (e.g., transistors 48) to minimize clock path jitter without over-voltage. The second stage sampling switches can use VddL for better integration with unit-ADCs 50.

Figure 3:
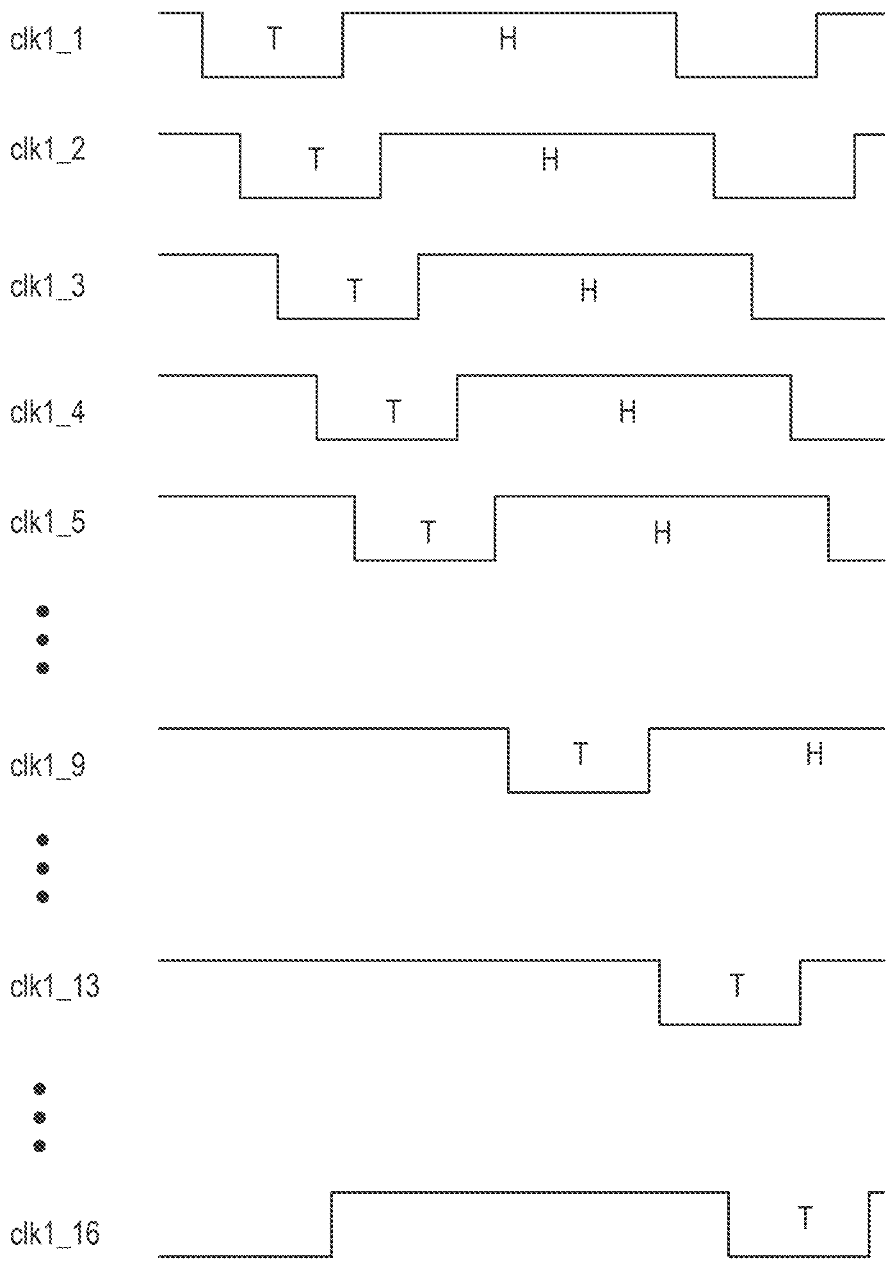
FIG. 3 is a diagram depicting clocks used by sampling switches in the first stage of a THA according to some embodiments.

FIG. 3 is a diagram depicting clocks used by sampling switches in the first stage of THA 18 according to some embodiments. In the example, the number of unit-ADCs 50 in TI-ADC 20 can be N=16. In such case, clock source 52 can generate 16 clocks designated clk1_1 through clk1_16. Each clock signal includes a tracking period (designated T) and a hold period (designated H). The track and hold periods of the clocks clk1_1 . . . clk1_16 can be shifted in time successively. The duty cycle of each clock can be less than 50% as shown such that the tracking period is less than the holding period.

Figure 4:
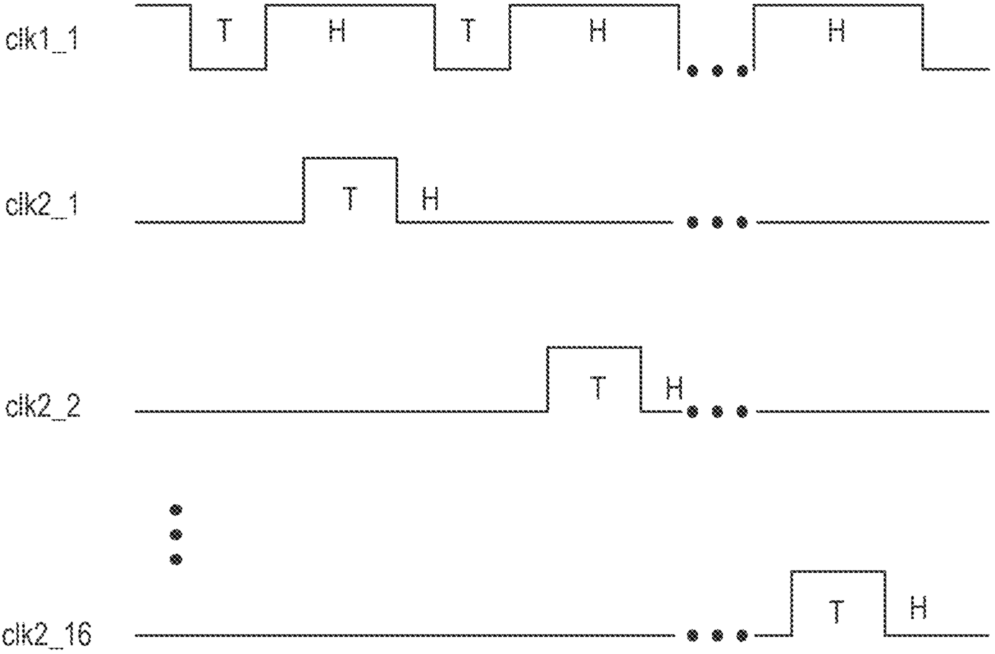
FIG. 4 is a diagram depicting clocks used by sampling switches in the second stage of a THA and the relationship with clocks used by the first stage according to some embodiments.

FIG. 4 is a diagram depicting clocks used by sampling switches in the second stage of THA 18 according to some embodiments. In the example, the number of unit-ADCs 50 in TI-ADC 20 can be N=16. In such case, clock source 54 can generate 16 clocks designated clk2_1 through clk2_16. Each clock signal includes a tracking period (designated T) and a hold period (designated H). The track and hold periods of the clocks clk2_1 . . . clk2_16 can be shifted in time successively. The track period of each clock clk2_1 . . . clk2_16 aligns with a hold period of clk1_1. The duty cycle of each clock clk2_1 . . . clk2_16 can be less than 50% as show such that the tracking period is less than the holding period and also less than the holding period of clk1_1.

Figure 5A:
FIG. 5A is a schematic diagram depicting an AFE according to embodiments.
Figure 5A:
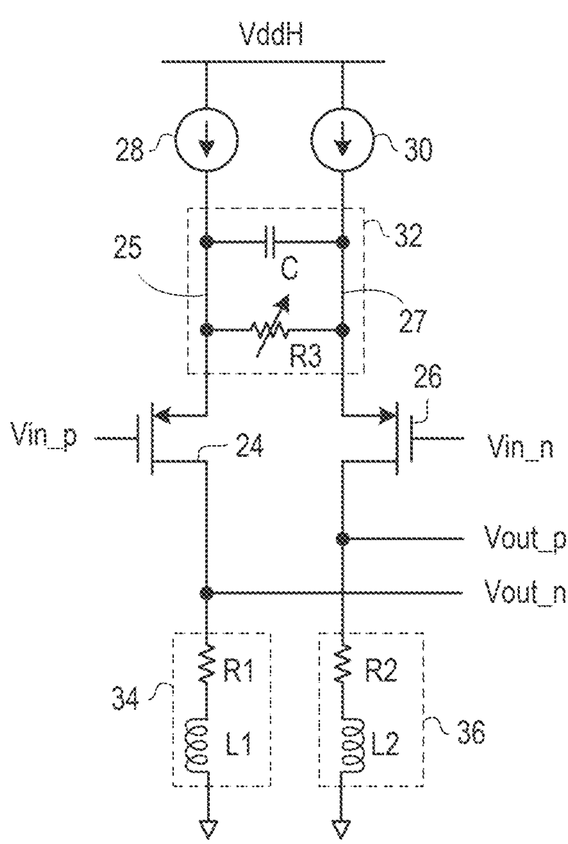
Figure 5B:
FIG. 5B is a schematic diagram depicting a first stage of a THA according to some embodiments.
Figure 5B:
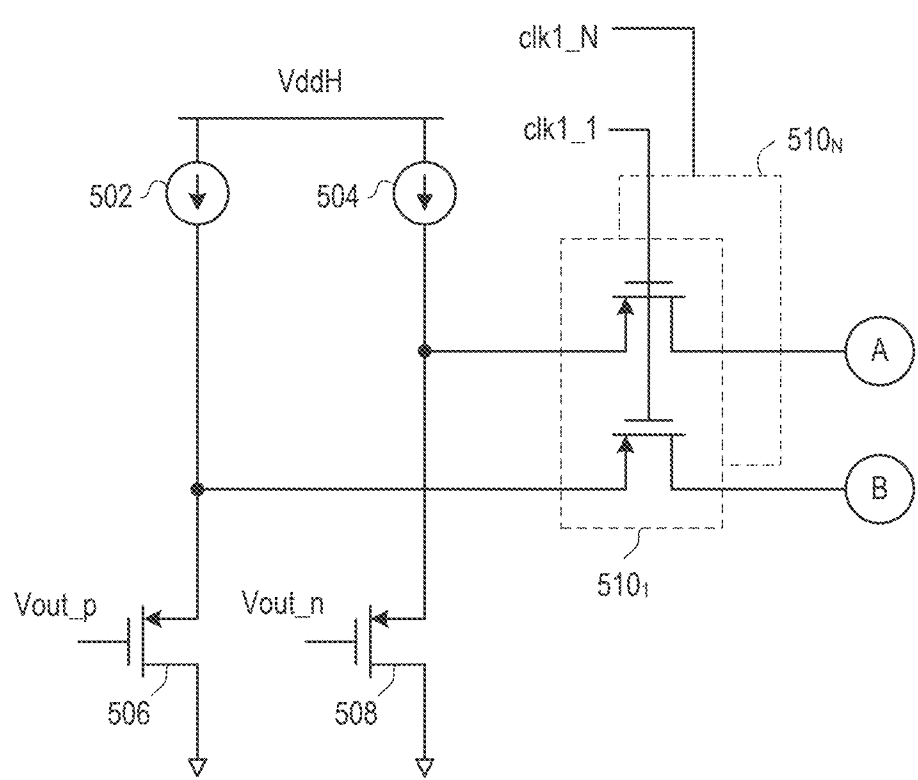
Figure 5C:
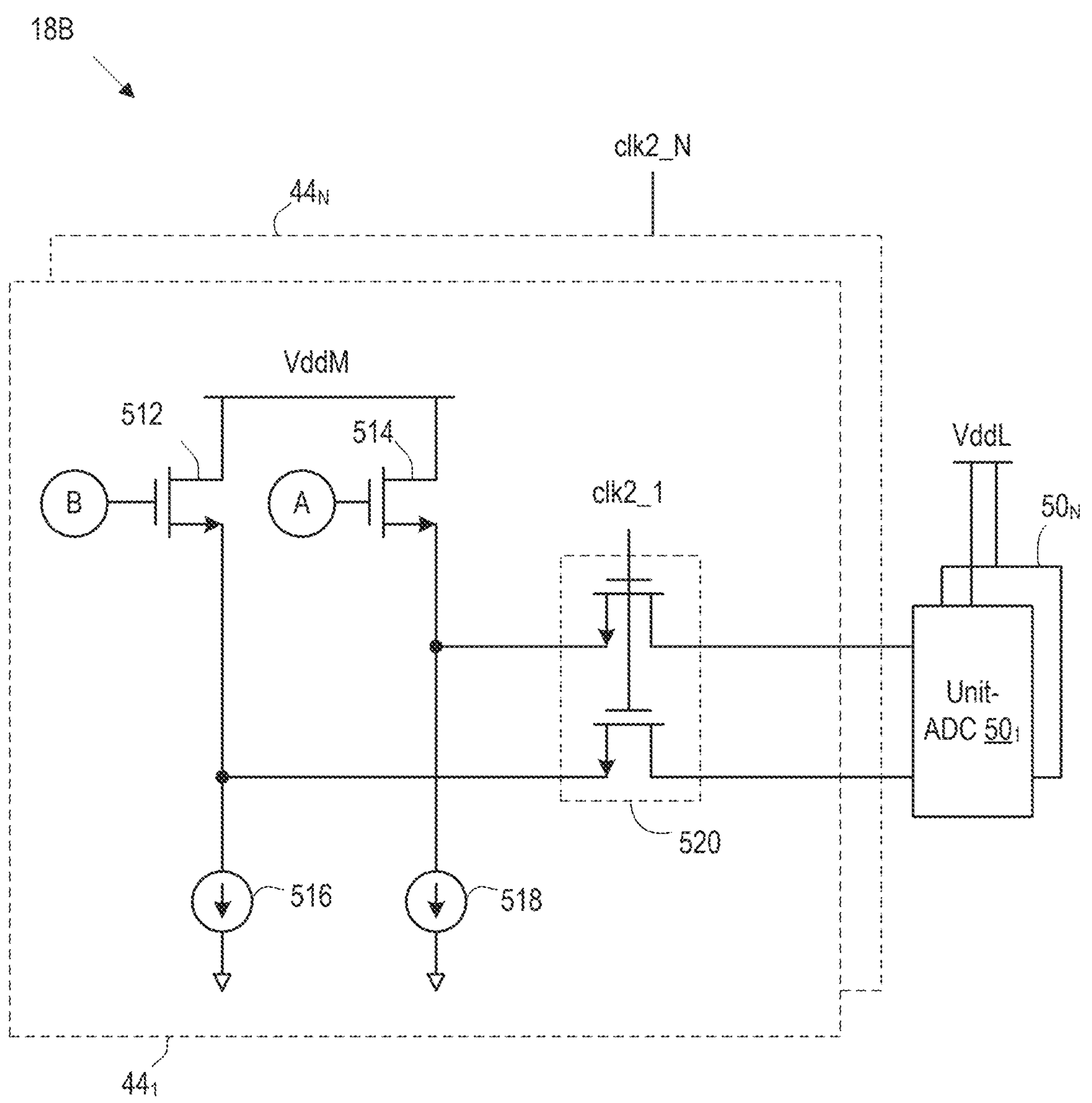
FIG. 5C is a schematic diagram depicting a second stage of a THA along with a TI-ADC according to some embodiments.

FIGS. 5A-5C show a schematic diagram of data path 17 using differential circuits according to some embodiments. In contrast, the circuits shown in FIG. 2 are single-ended circuits. FIG. 5A is a schematic diagram depicting AFE 16 according to embodiments. As shown in FIG. 5A, AFE 16 can include a differential input and a differential output. Components of AFE 18 as shown in FIG. 5A are the same or similar to those shown in FIG. 2. The differences being the gates of transistors 24 and 26 receive a differential input voltage signal (Vin_p, Vin_n) and the drains of transistors 24 and 26 providing a differential output voltage signal (Vout_n, Vout_p). AFE 16 otherwise operates as described above.

FIG. 5B is a schematic diagram depicting a first stage 18A of THA 18 according to some embodiments. As shown in FIG. 5B, first stage 18A of THA 18 can include a differential input and N differential outputs. First stage 18A can include transistors 506 and 508, current sources 502 and 504, and sampling switches $\mathbf{510}_1 \ldots \mathbf{510}_N$. Transistors 506 and 508 can be PMOS transistors. The gate of transistor 506 can receive the voltage signal Vout_p. The gate of transistor 508 can receive the voltage signal Vout_n. The drains of transistors 506 and 508 can be coupled to electrical ground. Current source 502 can be coupled between the voltage supply VddH and the source of transistor 506. Current source 504 can be coupled between the voltage supply VddH and the source of transistor 508. For purposes of clarity, only the details of sampling switch $\mathbf{510}_1$ are shown. Other sampling switches $\mathbf{510}_2 \ldots \mathbf{510}_N$ can be identical to sampling switch $\mathbf{510}_1$. Sampling switch $\mathbf{510}_1$ includes a pair of PMOS transistors the sources of which are coupled to the sources of transistors 506 and 508, respectively. The gates of the transistors in sampling switch $\mathbf{510}_1$ can be coupled to receive the clock signal clk1_1. Sampling switches $\mathbf{510}_2 \ldots \mathbf{510}_N$ can be coupled similarly to sampling switch $\mathbf{510}_1$.

FIG. 5C is a schematic diagram depicting a second stage 18B of THA 18 along with TI-ADC 20 according to some embodiments. As shown in FIG. 5C, second stage 18B of THA 18 can include N differential inputs and N differential outputs. Second stage 18B includes N circuits $\mathbf{44}_1 \ldots \mathbf{44}_N$ similar to the single-ended version shown in FIG. 2. However, each circuit 44 includes differential versions of the buffers and sampling switches. For purposes of clarity, only circuit $\mathbf{44}_1$ is shown in detail. Other circuits $\mathbf{44}_2 \ldots \mathbf{44}_N$ are identical to circuit $\mathbf{44}_1$. Circuit $\mathbf{44}_1$ includes transistors 512 and 514, current sources 516 and 518, and sampling switch 520. Transistors 512 and 514 can be NMOS transistors. Drains of transistors 512 and 514 can be coupled to the voltage supply VddM. The gate of transistor 512 can be coupled to the drain of one transistor in the sampling switch $\mathbf{510}_1$. The gate of transistor 514 can be coupled to the drain of the other transistor in the sampling switch $\mathbf{510}_1$. Current source 516 can be coupled between the source of transistor 512 and electrical ground. Current source 518 can be coupled between the source of transistor 514 and electrical ground. Sampling switch 520 can include a pair of transistors, which can be NMOS transistors. Sources of the NMOS transistors in sampling switch 520 can be coupled to sources of transistors 512 and 514, respectively. Drains of the NMOS transistors in sampling switch 520 can be coupled to inputs of unit-ADC $\mathbf{50}_1$. Gates of the NMOS transistors in sampling switch 520 can receive clock clk2_1. Circuits $\mathbf{44}_2 \ldots \mathbf{44}_N$ can be coupled and configured as shown for circuit $\mathbf{44}_1$.

While some processes and methods having various operations have been described, one or more embodiments also relate to a device or an apparatus for performing these operations. The apparatus may be specially constructed for required purposes, or the apparatus may be a general-purpose computer selectively activated or configured by a computer program stored in the computer. Various general-purpose machines may be used with computer programs written in accordance with the teachings herein, or it may be more convenient to construct a more specialized apparatus to perform the required operations.

Although one or more embodiments of the present invention have been described in some detail for clarity of understanding, certain changes may be made within the scope of the claims. Accordingly, the described embodiments are to be considered as illustrative and not restrictive, and the scope of the claims is not to be limited to details given herein but may be modified within the scope and equivalents of the claims. In the claims, elements and/or steps do not imply any particular order of operation unless explicitly stated in the claims.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term "couple" and its derivatives include: (a) electrical and communicative coupling; and (b) do not imply a direct connection, but rather may include intervening elements, unless described as "directly coupled."

Boundaries between components, operations, and data stores are somewhat arbitrary, and particular operations are illustrated in the context of specific illustrative configurations. Other allocations of functionality are envisioned and may fall within the scope of the invention. In general, structures and functionalities presented as separate components in exemplary configurations may be implemented as a combined structure or component. Similarly, structures and functionalities presented as a single component may be implemented as separate components. These and other variations, additions, and improvements may fall within the scope of the appended claims.

What is claimed is:

1. A data path for a receiver, comprising:

an analog front-end circuit (AFE) configured to receive a first voltage supply;

a first circuit coupled between an output of the AFE and an input of an analog-to-digital converter (ADC) of the receiver, the first circuit including:

a first buffer having an input coupled to the output of the AFE;

a second buffer;

a first switch coupled between an output of the first buffer and an input of the second buffer; and a second switch coupled between an output of the second buffer and the input of the ADC;

wherein the first buffer is configured to receive the first voltage supply, the second buffer is configured to receive a second voltage supply, and the ADC is configured to receive a third voltage supply less than the first voltage supply.

2. The data path of claim 1, wherein the first switch is configured to receive a first clock signal generated by a first clock source that is configured to receive the second supply voltage.

3. The data path of claim 2, wherein the second switch is configured to receive a second clock signal generated by a second clock source that is configured to receive the third supply voltage.

4. The data path of claim 1, wherein the ADC comprises a plurality of unit-ADCs, and wherein the second switch is coupled between the output of the second buffer and an input of a first unit-ADC of the plurality of unit-ADCs.

5. The data path of claim 1, wherein the AFE comprises a transconductance amplifier comprises p-type metal oxide semiconductor (PMOS) transistors.

6. The data path of claim 1, wherein the first buffer comprises a first p-type metal oxide semiconductor (PMOS) transistor and a current source, the current source coupled between the first voltage supply and a source of the first PMOS transistor, a drain of the first PMOS transistor coupled to electrical ground, and a gate of the first PMOS transistor coupled to the output of the AFE.

7. The data path of claim 6, wherein the first switch comprises a second PMOS transistor, a source of the second PMOS transistor coupled to the source of the first PMOS transistor, a drain of the second PMOS transistor coupled to the input of the second buffer, and a gate of the second PMOS transistor coupled to receive a clock signal.

8. The data path of claim 1, wherein the second buffer comprises a first n-type metal oxide semiconductor (NMOS) transistor and a current source, the current source coupled between a source of the first NMOS transistor and electrical ground, a drain of the first NMOS transistor coupled to the second voltage supply, and a gate of the first NMOS transistor coupled to the first switch.

9. The data path of claim 8, wherein the second switch comprises a second NMOS transistor, a source of the second NMOS transistor coupled to the source of the first NMOS transistor, a drain of the second NMOS transistor coupled to the input of the ADC, and a gate of the second NMOS transistor coupled to receive a clock signal.

10. A receiver, comprising:

an analog-to-digital converter (ADC);

an analog front-end circuit (AFE) configured to receive a first voltage supply;

a first circuit coupled between an output of the AFE and an input of the ADC, the first circuit including:

a first buffer having an input coupled to the output of the AFE;

a second buffer;

a first switch coupled between an output of the first buffer and an input of the second buffer; and a second switch coupled between an output of the second buffer and the input of the ADC;

wherein the first buffer is configured to receive the first voltage supply, the second buffer is configured to receive a second voltage supply less than the first voltage supply, and the ADC is configured to receive a third voltage supply less than the second voltage supply.

11. The receiver of claim 10, wherein the first switch is configured to receive a first clock signal generated by a first clock source that is configured to receive the second supply voltage.

12. The receiver of claim 11, wherein the second switch is configured to receive a second clock signal generated by a second clock source that is configured to receive the third supply voltage.

13. The receiver of claim 10, wherein the ADC comprises a plurality of unit-ADCs, and wherein the second switch is coupled between the output of the second buffer and an input of a first unit-ADC of the plurality of unit-ADCs.

14. The receiver of claim 10, wherein the AFE comprises a transconductance amplifier comprises p-type metal oxide semiconductor (PMOS) transistors.

15. The receiver of claim 10, wherein the first buffer comprises a first p-type metal oxide semiconductor (PMOS) transistor and a current source, the current source coupled between the first voltage supply and a source of the first PMOS transistor, a drain of the first PMOS transistor coupled to electrical ground, and a gate of the first PMOS transistor coupled to the output of the AFE.

16. The receiver of claim 15, wherein the first switch comprises a second PMOS transistor, a source of the second PMOS transistor coupled to the source of the first PMOS transistor, a drain of the second PMOS transistor coupled to the input of the second buffer, and a gate of the second PMOS transistor coupled to receive a clock signal.

17. The receiver of claim 10, wherein the second buffer comprises a first n-type metal oxide semiconductor (NMOS) transistor and a current source, the current source coupled between a source of the first NMOS transistor and electrical ground, a drain of the first NMOS transistor coupled to the second voltage supply, and a gate of the first NMOS transistor coupled to the first switch.

18. The receiver of claim 17, wherein the second switch comprises a second NMOS transistor, a source of the second NMOS transistor coupled to the source of the first NMOS transistor, a drain of the second NMOS transistor coupled to the input of the ADC, and a gate of the second NMOS transistor coupled to receive a clock signal.

19. A method of providing an input of an analog-to-digital converter (ADC), the method comprising:

receiving, by an analog front-end circuit (AFE), an analog signal, the AFE operating using a first voltage supply;

sampling, by a first circuit, an output of the AFE to provide the input of the ADC;

supplying the first voltage supply to a first buffer of the first circuit;

supplying a second voltage supply that is less than the first voltage supply to a second buffer of the first circuit; and supplying a third voltage supply that is less than the second voltage supply to the ADC.

20. The method of claim 19, further comprising:

supplying a first clock signal to a first switch coupled between an output of the first buffer and an input of the second buffer, the first clock signal generated by a first clock source receiving the second supply voltage; and supplying a second clock signal to a second switch coupled between an output of the second buffer and the input of the ADC, the second clock signal generated by a second clock source receiving the third supply voltage.

* * * * *